(12) United States Patent
Derderian et al.

(10) Patent No.: US 6,420,230 B1
(45) Date of Patent: Jul. 16, 2002

(54) CAPACITOR FABRICATION METHODS AND CAPACITOR CONSTRUCTIONS

(75) Inventors: Garo J. Derderian; Gurtej S. Sandhu, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/652,532

(22) Filed: Aug. 31, 2000

(51) Int. Cl.$^7$ .......................................... H01L 21/8242
(52) U.S. Cl. ...................... 438/255; 438/253; 438/254; 438/256; 438/396; 438/397; 438/398; 438/399
(58) Field of Search ................ 438/253–256, 438/396–399

(56) References Cited

U.S. PATENT DOCUMENTS

| | | | |
|---|---|---|---|
| 5,316,982 A | * | 5/1994 | Taniguchi .................... 438/396 |
| 5,432,732 A | * | 7/1995 | Ohmi .......................... 257/296 |
| 5,641,984 A | * | 6/1997 | Aftergut et al. ............. 257/432 |
| 6,204,172 B1 | | 9/1998 | Marsh |
| 6,281,142 B1 | | 6/1999 | Basceri et al. |
| 6,104,049 A | | 8/2000 | Solayappan et al. |
| 6,124,158 A | * | 9/2000 | Dautartas et al. ........... 438/216 |
| 6,144,060 A | * | 11/2000 | Park et al. ................... 257/310 |
| 6,156,606 A | * | 12/2000 | Michaelis .................... 438/239 |
| 6,174,770 B1 | | 1/2001 | Chi |
| 6,180,447 B1 | | 1/2001 | Park et al. |
| 6,180,481 B1 | | 1/2001 | Deboer et al. |
| 6,218,256 B1 | | 4/2001 | Agarwal |
| 6,218,260 B1 | * | 4/2001 | Lee et al. .................... 438/240 |
| 6,242,299 B1 | * | 6/2001 | Hickert ....................... 438/240 |
| 6,249,056 B1 | * | 6/2001 | Kwon et al. ................ 257/751 |
| 6,274,428 B1 | * | 8/2001 | Wu ............................. 438/255 |
| 6,291,289 B2 | | 9/2001 | Rhodes |
| 6,335,240 B1 | * | 1/2002 | Kim et al. ................... 438/253 |

OTHER PUBLICATIONS

A. W. Ott, et al., "Atomic layer controlled deposition of $Al_2O_3$ films using binary reaction sequence chemistry" Applied Surface Science (107) 1996, pp. 128–136.
U.S. application No. 09/653,149, Derderian, filed Aug. 31, 2000.
U.S. application No. 09/653,156, Agarwal, filed Aug. 31, 2000.

* cited by examiner

Primary Examiner—John F. Niebling
Assistant Examiner—Jennifer M. Kennedy
(74) Attorney, Agent, or Firm—Wells St. John P.S.

(57) ABSTRACT

A capacitor fabrication method may include forming a first capacitor electrode over a substrate and atomic layer depositing an insulative barrier layer to oxygen diffusion over the first electrode. A capacitor dielectric layer may be formed over the first electrode and a second capacitor electrode may be formed over the dielectric layer. The barrier layer may include $Al_2O_3$. A capacitor fabrication method may also include forming a first capacitor electrode over a substrate, chemisorbing a layer of a first precursor at least one monolayer thick over the first electrode, and chemisorbing a layer of a second precursor at least one monolayer thick on the first precursor layer. A chemisorption product of the first and second precursors may be comprised by a layer of an insulative barrier material. The first precursor may include $H_2O$ and the second precursor may include trimethyl aluminum.

31 Claims, 4 Drawing Sheets

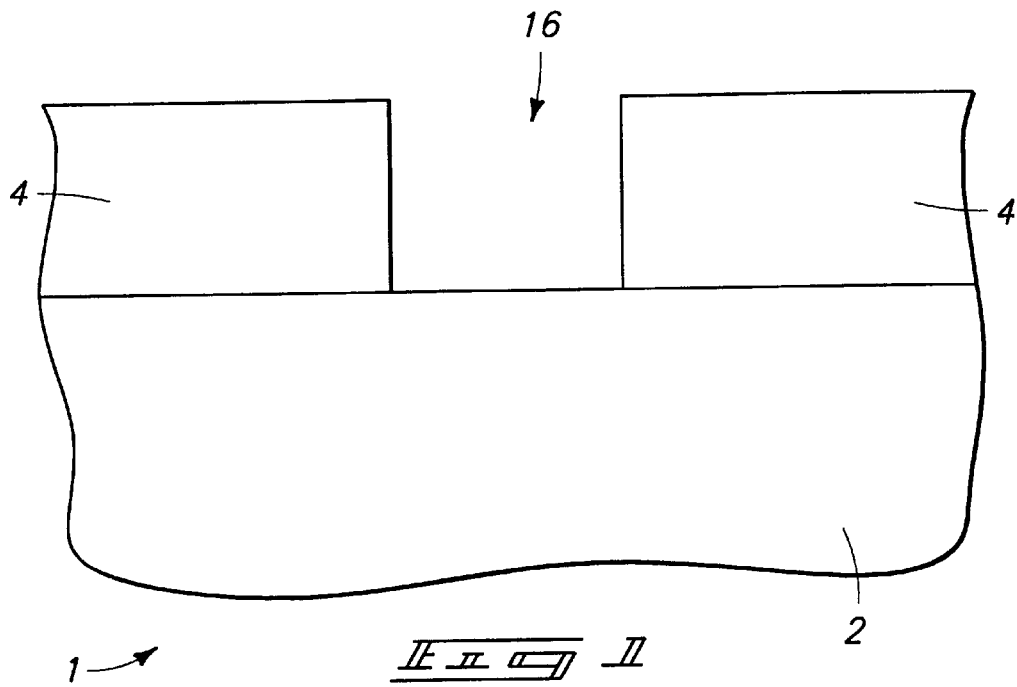
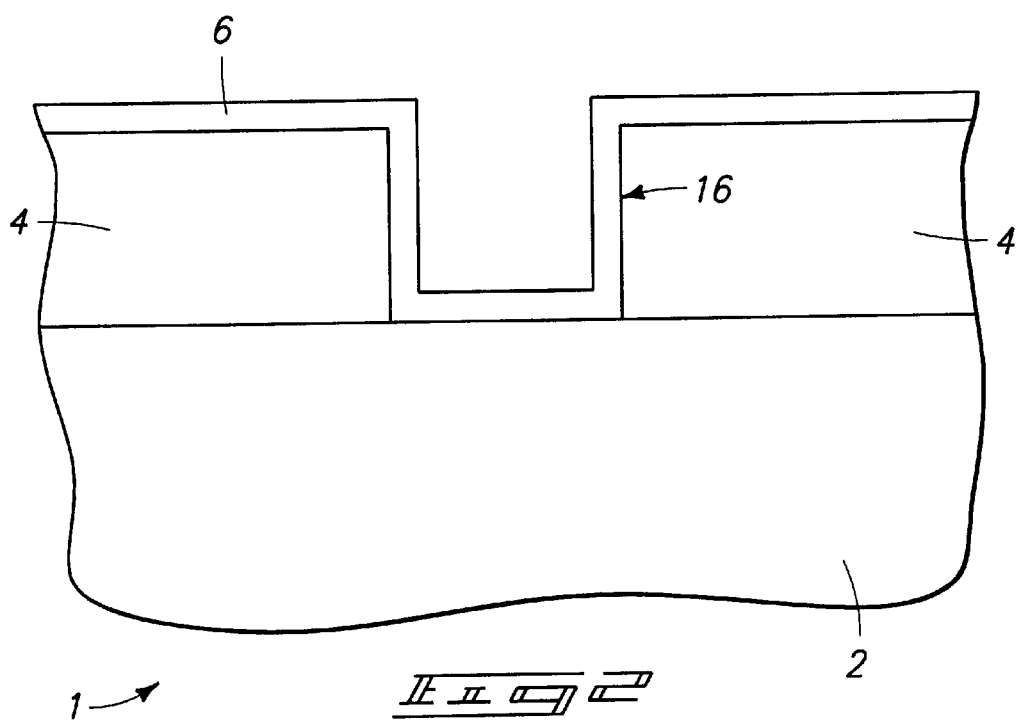

CAPACITOR FABRICATION METHODS AND CAPACITOR CONSTRUCTIONS

TECHNICAL FIELD

The aspects of the invention relate to capacitor fabrication methods including forming insulative barrier layers and capacitor constructions having insulative barrier layers.

BACKGROUND OF THE INVENTION

Capacitors are common devices used in electronics, such as integrated circuits, and particularly semiconductor-based technologies. Two common capacitor structures include metal-insulator-metal (MIM) capacitors and metal-insulator-semiconductor (MIS) capacitors. One important factor to consider when selecting a capacitor structure may be the capacitance per unit area. MIS capacitors may be advantageous since a first electrode as the semiconductor may be formed of hemispherical grain (HSG) polysilicon that exhibits a higher surface area in a given region compared to a planar surface of amorphous polysilicon. The higher surface area provides more capacitance per unit area occupied by a capacitor.

However, a high K factor (also known as dielectric constant or "κ") dielectric material may be desirable to further enhance capacitance. $Ta_2O_5$ is one example of a high K factor dielectric, but it inherently forms an interfacial dielectric layer of $SiO_2$ when formed on a capacitor electrode comprising HSG. The interfacial dielectric exhibits a lower K factor than $Ta_2O_5$ and thus reduces the effective dielectric constant for the capacitor construction. Such reduction may be significant enough to eliminate any gain in capacitance per unit area otherwise achieved by using HSG instead of a planar electrode. Use of other oxygen containing high K dielectric materials has proved to create similar problems.

Because it may be desirable to provide area enhancement of an electrode in a MIM structure using HSG, one attempt at addressing the stated problem is forming a silicon nitride insulative barrier layer over the HSG. The silicon nitride barrier layer may be formed by nitridizing the silicon of the outer surface of HSG. Unfortunately, silicon nitride exhibits a K factor of only about 7, less than the K factor of some high K factor dielectrics that are desirable. Accordingly, even the silicon nitride barrier layer reduces the effective dielectric constant of the capacitor.

SUMMARY OF THE INVENTION

In accordance with one aspect of the invention, a capacitor fabrication method may include forming a first capacitor electrode over a substrate and atomic layer depositing an insulative barrier layer to oxygen diffusion over the first electrode. The method may further include forming a capacitor dielectric layer over the first electrode and forming a second capacitor electrode over the dielectric layer. By way of example, the atomic layer deposited barrier layer may comprise $Al_2O_3$. Also, the barrier layer may exhibit a K factor of greater than about 7 at 20° C. The dielectric layer may be over the barrier layer.

In another aspect of the invention, a capacitor fabrication method includes forming a first capacitor electrode over a substrate, chemisorbing a layer of a first precursor at least one monolayer thick over the first electrode, and chemisorbing a layer of a second precursor at least one monolayer thick on the first precursor layer. A chemisorption product of the first and second precursor layers may be comprised by a layer of an insulative barrier material. A capacitor dielectric layer may be formed over the first electrode and a second capacitor electrode may be formed over the dielectric layer. As an example, the first precursor may comprise $H_2O$ and the second precursor may comprise trimethyl aluminum. The dielectric layer may contact the barrier layer.

In yet another aspect of the invention, a capacitor fabrication method includes forming an opening in an insulative layer over a substrate and forming a layer of polysilicon in the opening. The polysilicon layer may be converted to a first capacitor electrode. An insulative barrier layer may be conformally formed on the first electrode and may comprise $Al_2O_3$. The barrier layer may be sufficiently thick and dense to reduce oxidation of the first electrode by oxygen diffusion from over the barrier layer. The method may further include forming a capacitor dielectric layer comprising oxygen on the barrier layer and forming a second capacitor electrode over the dielectric layer.

Other aspects of the invention include the capacitor constructions formed from the above described methods.

BRIEF DESCRIPTION OF THE DRAWINGS

Preferred embodiments of the invention are described below with reference to the following accompanying drawings.

FIG. 1 is an enlarged view of a section of a semiconductor wafer at one processing step in accordance with the invention.

FIG. 2 is an enlarged view of the section of the FIG. 1 wafer at a processing step subsequent to that depicted by FIG. 1.

DETAILED DESCRIPTION OF THE PREFERRED EMBODIMENTS

Figure 3:
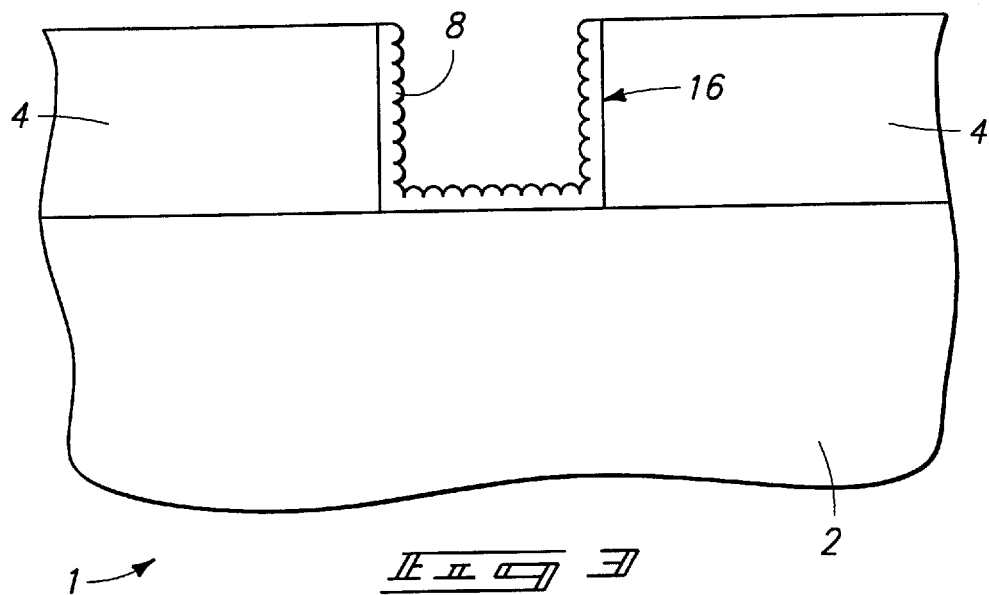
FIG. 3 is an enlarged view of the section of the FIG. 1 wafer at a processing step subsequent to that depicted by FIG. 2.

This disclosure of the invention is submitted in furtherance of the constitutional purposes of the U.S. Patent Laws "to promote the progress of science and useful arts" (Article 1, Section 8).

Atomic layer deposition (ALD) involves formation of successive atomic layers on a substrate. Such layers may comprise an epitaxial, polycrystalline, amorphous, etc. material. ALD may also be referred to as atomic layer epitaxy, atomic layer processing, etc. Further, the invention may encompass other deposition methods not traditionally referred to as ALD, for example, chemical vapor deposition (CVD), but nevertheless including the method steps described herein. The deposition methods herein may be described in the context of formation on a semiconductor wafer. However, the invention encompasses deposition on a variety of substrates besides semiconductor substrates.

In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Described in summary, ALD includes exposing an initial substrate to a first chemical species to accomplish chemisorption of the species onto the substrate. Theoretically, the chemisorption forms a monolayer that is uniformly one atom or molecule thick on the entire exposed initial substrate. In other words, a saturated monolayer. Practically, as further described below, chemisorption might not occur on all portions of the substrate. Nevertheless, such an imperfect monolayer is still a monolayer in the context of this document. In many applications, merely a substantially saturated monolayer may be suitable. A substantially saturated monolayer is one that will still yield a deposited layer exhibiting the quality and/or properties desired for such layer.

The first species is purged from over the substrate and a second chemical species is provided to chemisorb onto the first monolayer of the first species. The second species is then purged and the steps are repeated with exposure of the second species monolayer to the first species. In some cases, the two monolayers may be of the same species. Also, a third species or more may be successively chemisorbed and purged just as described for the first and second species.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include $N_2$, Ar, He, Ne, Kr, Xe, etc. Purging may instead include contacting the substrate and/or monolayer with any substance that allows chemisorption byproducts to desorb and reduces the concentration of a contacting species preparatory to introducing another species. A suitable amount of purging can be determined experimentally as known to those skilled in the art. Purging time may be successively reduced to a purge time that yields an increase in film growth rate. The increase in film growth rate might be an indication of a change to a non-ALD process regime and may be used to establish a purge time limit.

ALD is often described as a self-limiting process, in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting. Accordingly, ALD may also encompass a species forming other than one monolayer at a time by stacking of a species, forming a layer more than one atom or molecule thick. The various aspects of the present invention described herein are applicable to any circumstance where ALD may be desired. Often, traditional ALD occurs within an often-used range of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside the traditional temperature and pressure ranges may risk formation of defective monolayers.

The general technology of chemical vapor deposition (CVD) includes a variety of more specific processes, including, but not limited to, plasma enhanced CVD and others. CVD is commonly used to form non-selectively a complete, deposited material on a substrate. One characteristic of CVD is the simultaneous presence of multiple species in the deposition chamber that react to form the deposited material. Such condition is contrasted with the purging criteria for traditional ALD wherein a substrate is contacted with a single deposition species that chemisorbs to a substrate or previously deposited species. An ALD process regime may provide a simultaneously contacted plurality of species of a type or under conditions such that ALD chemisorption, rather than CVD reaction occurs. Instead of reacting together, the species may chemisorb to a substrate or previously deposited species, providing a surface onto which subsequent species may next chemisorb to form a complete layer of desired material. Under most CVD conditions, deposition occurs largely independent of the composition or surface properties of an underlying substrate. By contrast, chemisorption rate in ALD might be influenced by the composition, crystalline structure, and other properties of a substrate or chemisorbed species. Other process conditions, for example, pressure and temperature, may also influence chemisorption rate.

ALD, as well as other deposition methods and/or methods of forming insulative barrier layers may be useful in capacitor fabrication methods. According to one aspect of the invention, a capacitor fabrication method includes forming a first capacitor electrode over a substrate and atomic layer depositing an insulative barrier layer to oxygen diffusion over the first electrode. A capacitor dielectric layer may be formed over the first electrode and a second capacitor electrode may be formed over the dielectric layer. At least one of the first or second electrodes may comprise polysilicon, which may be rugged polysilicon, preferably hemispherical grain (HSG) polysilicon. Also, at least one of the electrodes might comprise $RuO_x$. The dielectric layer may comprise oxygen. Exemplary materials for the dielectric layer include, but are not limited to, $Ta_2O_5$, barium strontium titanate, $TiO_2$, $Y_2O_3$, $HfO_2$, $ZrO_2$, $HfSiO_2$, $ZrSiO_2$, etc.

Notably, the insulative barrier layer to oxygen diffusion formed over the first electrode may provide the advantage of reducing oxidation of the electrode by oxygen diffusion from an oxygen source, for example, the dielectric layer. The dielectric may be formed over the barrier layer, thus, the barrier layer may reduce oxygen diffusion to the first capacitor electrode. Alternatively, such barrier layer may reduce oxygen diffusion from the first capacitor electrode or under the first capacitor electrode to the dielectric layer or second capacitor electrode. It follows then that the barrier layer may also be formed over the capacitor dielectric layer with the second capacitor electrode over the barrier layer such that the barrier layer reduces oxygen diffusion from the dielectric layer to the second electrode. Such positioning may also reduce oxygen diffusion from over the dielectric layer to the first capacitor electrode, for example, oxygen diffusion from the second capacitor electrode. Such may be a problem when the second capacitor electrode comprises $RuO_x$.

Accordingly, one aspect of the invention may include atomic layer depositing the barrier layer over the first electrode, forming the dielectric layer over the barrier layer, and atomic layer depositing another conductive barrier layer to oxygen diffusion over the dielectric layer. Forming the first and second electrodes and dielectric layer may be accomplished by methods known to those skilled in the art and may include atomic layer deposition, but preferably other methods.

The atomic layer depositing of the barrier layer may occur at a temperature of from about 100 to about 600° C. and at a pressure of from about 100 milliTorr (mT) to about 10 Torr (T). The atomic layer deposited barrier layer may exhibit a K factor of greater than about 7 at 20° C. Preferably, the barrier layer may exhibit a K factor of about 10 at 20° C. One particularly suitable material for the barrier layer includes $Al_2O_3$. The barrier layer may have a thickness of less than about 30 Angstroms or another thickness depending on the material properties. Preferably, the barrier layer may have a thickness of less than about 12 Angstroms, or more preferably less than about 6 Angstroms. As an example, a 30 Angstrom film of $Al_2O_3$ protected a WN film from oxidation during annealing at 700° C. for 60 seconds in an $O_2$ ambient. Thinner $Al_2O_3$ films may also be suitable.

One consideration in selecting a material for the barrier layer is the thickness and density of the barrier layer that will be sufficient to achieve a desired level of oxygen diffusion reduction. Another factor to evaluate is that the barrier layer might be considered to form a part of a capacitor dielectric when the barrier layer contacts the dielectric layer since the barrier layer is insulative. Accordingly, it may be advantageous to recalculate the desired dimensions of a dielectric layer contacted by the barrier layer accounting for the presence of the additional insulative material. Accordingly, an "insulative" material as the term is used herein designates a material exhibiting a conductivity at 20° C. of less than $10^4$ microOhm$^{-1}$ centimeter$^{-1}$. As an alternative, an "insulative" material in the present context might be viewed as a material that impacts the capacitance otherwise achieved without the material. Generally, a "conductive" or "semiconductive" material might not produce a change in capacitance as such a barrier layer. A combined capacitor dielectric and insulative barrier layer according to the aspects of the invention can exhibit a leakage current of less than about $10^{-15}$ amps per cell and yield a capacitance of greater than about 20 femtoFarads per cell.

As another aspect of the invention, a capacitor fabrication method may include forming a first capacitor electrode over a substrate, chemisorbing a layer of a first precursor at least one monolayer thick over the first electrode, and chemisorbing a layer of a second precursor at least one monolayer thick over the first precursor layer. A chemisorption product of the first and second precursor layers may be comprised by a layer of an insulative barrier material. Because the chemisorption product is comprised by the barrier layer, the barrier layer may also include insulative barrier material that is not a chemisorption product of the first and second precursor layers. A capacitor dielectric layer may be formed over the first electrode and a second capacitor electrode may be formed over the dielectric layer. The various positions for the barrier layer discussed above are also applicable to the present aspect of the invention.

In forming the chemisorption product of the first and second precursor layers, the first and second precursor layers may each consist essentially of a monolayer. Further, the first and second precursor layers may each comprise substantially saturated monolayers. The extent of saturation might not be complete and yet the barrier layer may nevertheless provide the desired properties. Thus, substantially saturated may be adequate. The first and second precursor may each consist essentially of only one chemical species. However, as described above, precursors may also comprise more than one chemical species. Preferably, the first precursor is different from the second precursor, although for some barrier layers, the first and second precursor might be the same.

One example of a precursor pair for forming $Al_2O_3$ includes $H_2O$ and trimethyl aluminum (TMA). It is conceivable that more than one pair of precursors may comprise the first and second precursors, but preferably only one pair. Additional alternating first and second precursor layers may be chemisorbed in keeping with the above aspect of the invention to achieve a desired thickness for the barrier layer.

Although ALD and/or chemisorbing the first and second precursors may be suitable for forming a barrier layer, other methods may also be suitable. Accordingly, a variety of barrier layer forming techniques may be used in combination with techniques to increase electrode surface area to provide enhancement of capacitance per unit area. FIGS. 1–6 exemplify the features of the various aspects of the invention described above, as well as other aspects of the invention. For example, enhancing capacitance per unit area.

Figure 4:
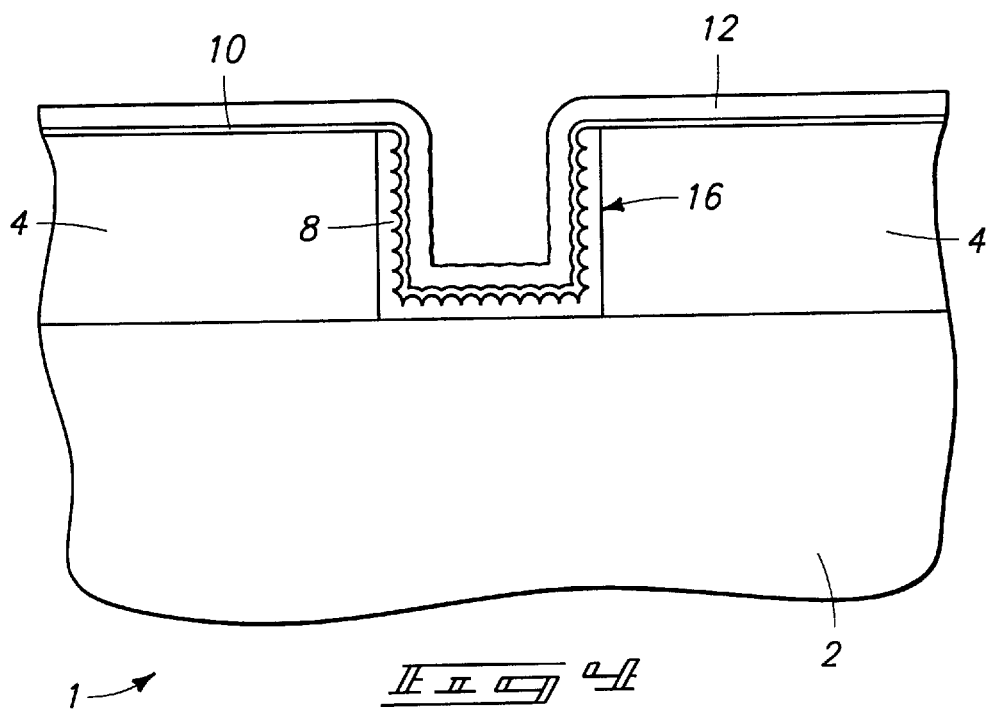
FIG. 4 is an enlarged view of the section of the FIG. 1 wafer at a processing step subsequent to that depicted by FIG. 3.
Figure 5:
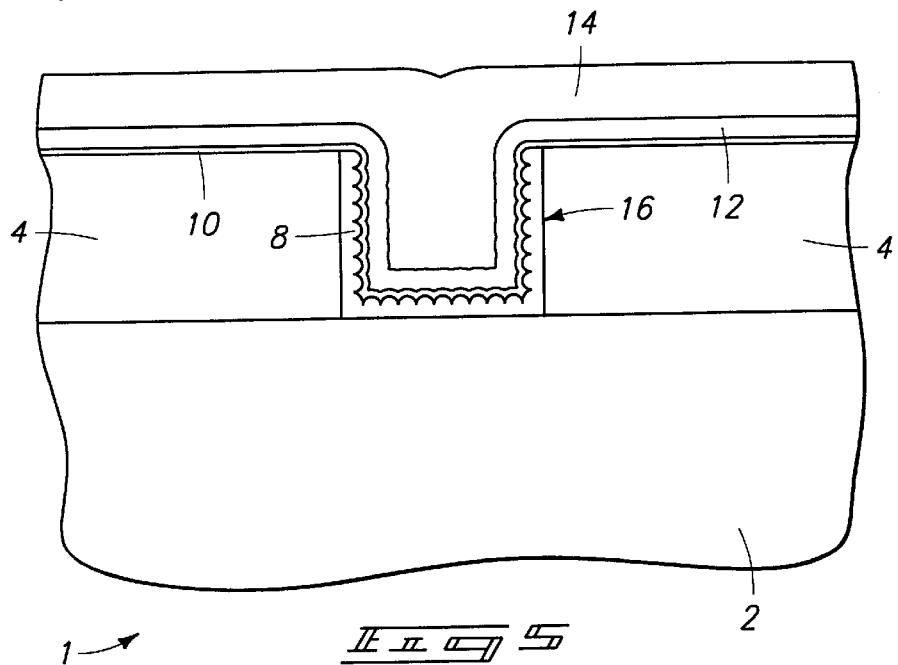
FIG. 5 is an enlarged view of the section of the FIG. 1 wafer at a processing step subsequent to that depicted by FIG. 4.
Figure 6:
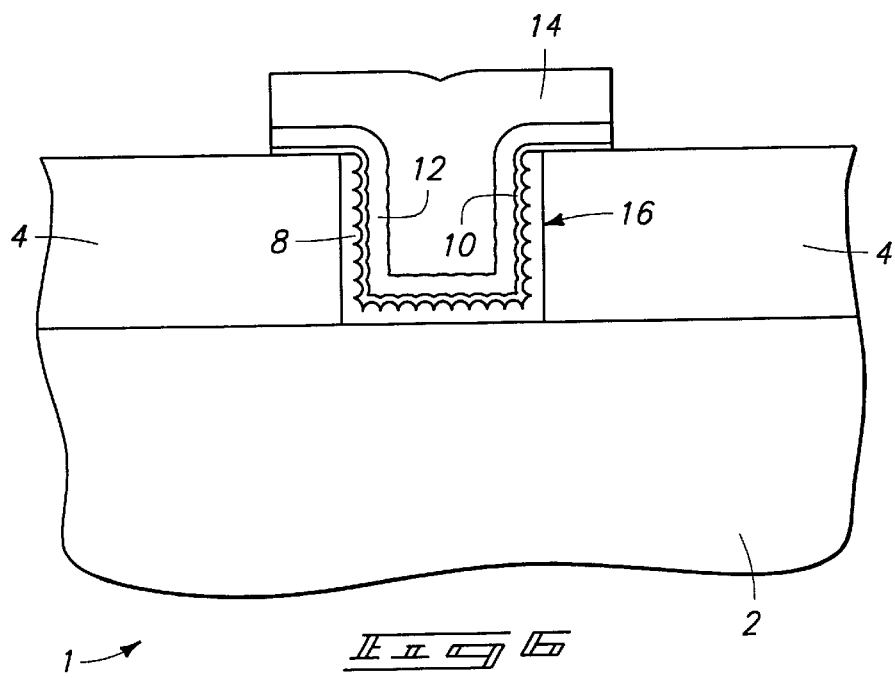
FIG. 6 is an enlarged view of the section of the FIG. 1 wafer at a processing step subsequent to that depicted by FIG. 5.
Figure 7:
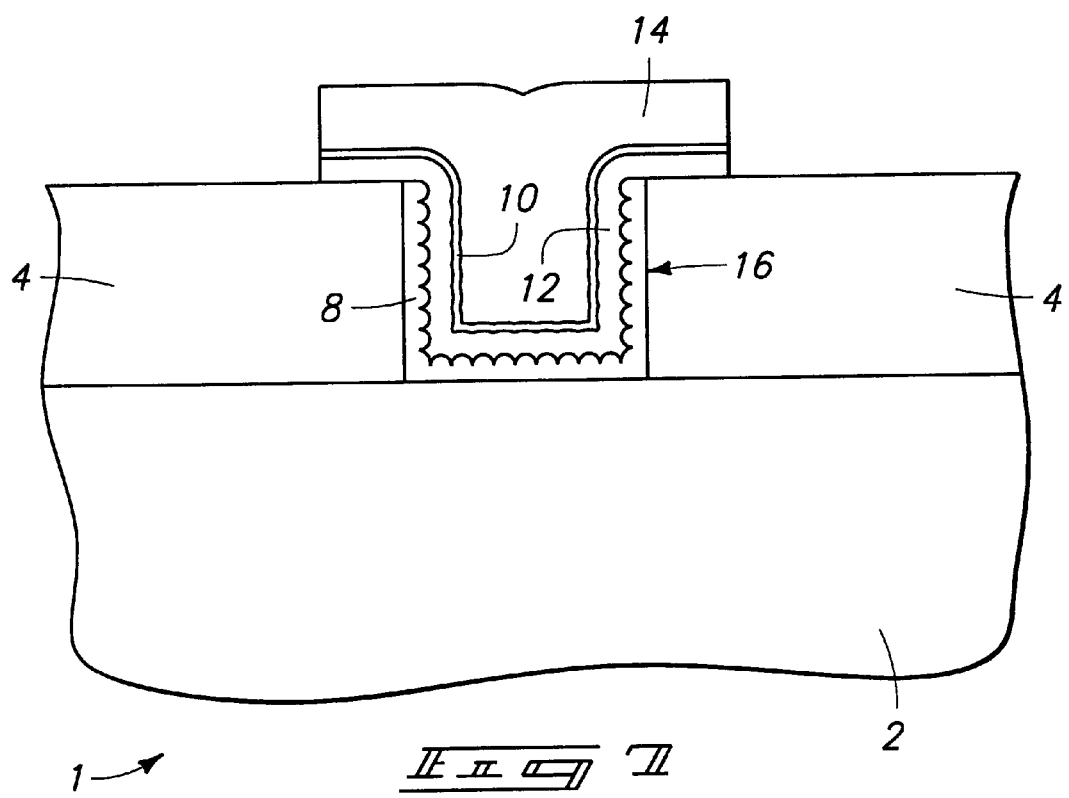
FIG. 7 is an enlarged view of a section of an alternate embodiment semiconductor wafer processed in accordance with alternate aspects of the invention.

Turning to FIG. 1, wafer portion 1 is shown including a substrate 2 with an insulative layer 4 formed thereon. A capacitor fabrication method may include forming an opening 16 in insulative layer 4, the opening 16 having sides and a bottom. Turning to FIG. 2, a layer of polysilicon 6 may be formed over the sides and bottom of the opening. Polysilicon layer 6 may then be converted to a first capacitor electrode 8 comprising hemispherical grain polysilicon, as shown in FIG. 3. In FIG. 4, an insulative barrier layer 10 may be conformally formed on first electrode 8. Barrier layer 10 may comprise $Al_2O_3$ and be sufficiently thick and dense to reduce oxidation of the first electrode by oxygen diffusion from over barrier layer 10. A capacitor dielectric layer 12 may be formed on barrier layer 10. One source of oxygen diffusion may be dielectric layer 12. In FIG. 5, a second capacitor electrode layer 14 is shown formed on dielectric layer 12. FIG. 6 shows excess portions of barrier layer 10, dielectric layer 12, and second capacitor electrode layer 14 removed from over insulative layer 4 to form a capacitor structure. As described above, a barrier layer may also be formed over a dielectric layer, thus FIG. 7 alternatively shows barrier layer 10 over dielectric layer 12.

As an example, $Al_2O_3$ deposition from TMA/$H_2O$ was conducted at a substrate temperature from about 300 to about 500° C. and chamber pressure of about 200 mT using a GENUS LYNX 2™ ALD tool. The GENUS LYNX 2™ tool controls gas flow rate using pressure settings. The first step of the cycle included pulsing $H_2O$ set at about 20–25 T for from about 200 to about 2000 microseconds ($\mu$sec) in a $N_2$ carrier set at about 40 T. A $N_2$ carrier set at about 74 T was pulsed for from about 1 to about 3 sec to purge the $H_2O$. Next, TMA set at about 20–25 T was pulsed for from about 80 to about 1000 $\mu$sec in a $N_2$ carrier set at about 40 T followed by purging as indicated to complete the cycle. Gases were removed using an exhaust pump. The $Al_2O_3$ formed exhibited a K factor of approximately 9.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A capacitor fabrication method comprising:
   forming a first capacitor electrode over a substrate;
   atomic layer depositing an insulative barrier layer to oxygen diffusion over the first electrode, the barrier layer having a thickness of less than 10 Angstroms and comprising $Al_2O_3$;
   forming a capacitor dielectric layer over the first electrode; and
   forming a second capacitor electrode over the dielectric layer and the barrier layer, at least one of the dielectric layer and the second electrode comprising oxygen that is diffusable into the first electrode absent the barrier layer.

2. The method of claim 1 wherein the second capacitor electrode comprises $RuO_x$.

3. The method of claim 1 wherein the atomic layer deposited barrier layer has a thickness of less than about 6 Angstroms.

4. The method of claim 1 wherein the atomic layer deposited barrier layer contacts the dielectric layer.

5. The method of claim 1 wherein the atomic layer deposited barrier layer consists of $Al_2O_3$.

6. The method of claim 1 wherein the atomic layer deposited barrier layer exhibits a K factor of greater than about 7 at 20° C.

7. The method of claim 1 wherein the atomic layer deposited barrier layer exhibits a K factor of about 10.

8. The method of claim 1 wherein at least one of the first or second electrodes comprises polysilicon and the dielectric layer comprises oxygen.

9. The method of claim 1 wherein the dielectric layer comprises $Ta_2O_5$ or barium strontium titanate.

10. The method of claim 1 wherein the dielectric layer is over the barrier layer.

11. The method of claim 10 further comprising atomic layer depositing another insulative barrier layer to oxygen diffusion over the dielectric layer.

12. The method of claim 1 wherein the forming the first and second electrodes and the dielectric layer occur by other than atomic layer deposition.

13. A capacitor fabrication method comprising:
    forming a first capacitor electrode over a substrate;
    chemisorbing a layer of a first precursor at least one monolayer thick over the first electrode;
    chemisorbing a layer of a second precursor at least one monolayer thick on the first precursor layer, a chemisorption product of the first and second precursor layers being comprised by a layer of an insulative barrier material to oxygen diffusion, the barrier material layer having a thickness of less than 10 Angstroms;
    forming a capacitor dielectric layer over the first electrode; and
    forming a second capacitor electrode over the dielectric layer and the barrier layer, at least one of the dielectric layer and the second electrode comprising oxygen that is diffusable into the first electrode absent the barrier layer.

14. The method of claim 13 wherein the first and second precursor layers each consist essentially of a monolayer.

15. The method of claim 13 wherein the first and second precursor layers each comprise substantially saturated monolayers.

16. The method of claim 13 wherein the first and second precursor each consist essentially of only one chemical species.

17. The method of claim 13 wherein the first precursor is different from the second precursor.

18. The method of claim 13 wherein the first precursor comprises $H_2O$ and the second precursor trimethyl aluminum.

19. The method of claim 13 wherein the dielectric layer is over the barrier layer, further comprising chemisorbing additional alternating first and second precursor layers before forming the dielectric layer.

20. The method of claim 19 wherein the barrier layer has a thickness of less than about 6 Angstroms.

21. The method of claim 13 wherein the second capacitor electrode comprises $RuO_x$.

22. The method of claim 13 wherein the atomic layer deposited barrier layer contacts the dielectric layer.

23. The method of claim 22 wherein the dielectric layer and barrier layer in combination exhibit a leakage current of less than about $10^{-15}$ amps per cell and yield a capacitance of greater than about 20 femtoFarads per cell.

24. The method of claim 13 wherein the barrier layer comprises $Al_2O_3$.

25. The method of claim 13 wherein the barrier layer exhibits a K factor of greater than about 7 at 20° C.

26. The method of claim 13 wherein the barrier layer exhibits a K factor of about 10.

27. A capacitor fabrication method comprising:
    forming an opening in an insulative layer over a substrate, the opening having sides and a bottom;
    forming a layer of polysilicon over the sides and bottom of the opening;
    converting the polysilicon layer to a first capacitor electrode comprising hemispherical grain polysilicon;
    atomic layer depositing an insulative barrier layer to oxygen diffusion on the first electrode, the barrier layer comprising $Al_2O_3$ and having a thickness of less than 10 Angstroms;
    forming a capacitor dielectric layer comprising oxygen on the barrier layer, the oxygen being diffusable into the first electrode absent the barrier layer; and
    forming a second capacitor electrode over the dielectric layer.

28. The method of claim 27 wherein the dielectric layer and barrier layer in combination exhibit a leakage current of less than about $10^{-15}$ amps per cell and yield a capacitance of greater than about 20 femtoFarads per cell.

29. The method of claim 27 wherein the forming the barrier layer comprises:
    chemisorbing a layer of a first precursor at least one monolayer thick over the first electrode;
    chemisorbing a layer of a second precursor at least one monolayer thick on the first precursor layer, a chemisorption product of the first and second precursor layers being comprised by the barrier layer.

30. The method of claim 27 wherein the second capacitor electrode comprises $RuO_x$.

31. The method of claim 27 wherein the barrier layer exhibits a K factor of greater than about 7 to 20° C.

* * * * *

UNITED STATES PATENT AND TRADEMARK OFFICE
CERTIFICATE OF CORRECTION

PATENT NO. : 6,420,230 B1
APPLICATION NO. : 09/652532
DATED : July 16, 2002
INVENTOR(S) : Derderian et al.

It is certified that error appears in the above-identified patent and that said Letters Patent is hereby corrected as shown below:

Column 5, lines 25 to 46
Please replace the paragraph with the following replacement paragraph.

--One consideration in selecting a material for the barrier layer is the thickness and density of the barrier layer that will be sufficient to achieve a desired level of oxygen diffusion reduction. Another factor to evaluate is that the barrier layer might be considered to form a part of a capacitor dielectric when the barrier layer contacts the dielectric layer since the barrier layer is insulative. Accordingly, it may be advantageous to recalculate the desired dimensions of a dielectric layer contacted by the barrier layer accounting for the presence of the additional insulative material. Accordingly, an "insulative" material as the term is used herein designates a material exhibiting a conductivity at 20°C of less than $10^{-12}$ microOhm$^{-1}$ centimeter$^{-1}$. As an alternative, an "insulative" material in the present context might be viewed as a material that impacts the capacitance otherwise achieved without the material. Generally, a "conductive" or "semiconductive" material might not produce a change in capacitance as such a barrier layer. A combined capacitor dielectric and insulative barrier layer according to the aspects of the invention can exhibit a leakage current of less than about 10-15 amps per cell and yield a capacitance of greater than about 20 femtoFarads per cell.--

Signed and Sealed this

Nineteenth Day of May, 2009

JOHN DOLL
*Acting Director of the United States Patent and Trademark Office*